United States Patent [19]

Akiba et al.

[11] Patent Number: 4,720,835
[45] Date of Patent: Jan. 19, 1988

[54] INTEGRATED SEMICONDUCTOR LIGHT EMITTING ELEMENT WITH OSCILLATION WAVELENGTH AND PHASE MODULATED LIGHT OUTPUT

[75] Inventors: Shigeyuki Akiba, Tokyo; Katsuyuki Utaka, Musashino; Yukio Noda, Yokohama; Yukitoshi Kushiro, Tokyo, all of Japan

[73] Assignee: Kokusai Denshin Denwa K.K., Tokyo, Japan

[21] Appl. No.: 767,152

[22] Filed: Aug. 19, 1985

[30] Foreign Application Priority Data

Aug. 27, 1984 [JP] Japan .................................. 59-176838

[51] Int. Cl.⁴ ............................................... H01S 3/19
[52] U.S. Cl. ......................................... 372/50; 372/26; 372/28; 372/96
[58] Field of Search ................ 372/50, 26, 28, 96; 357/17

[56] References Cited

U.S. PATENT DOCUMENTS 4,553,239  11/1985  Akuba et al. ........................ 372/50
4,563,765  1/1986  Tsang et al. ......................... 372/50

FOREIGN PATENT DOCUMENTS 2148595  5/1985  United Kingdom ................ 372/96
2151401  7/1985  United Kingdom ................ 372/96

Primary Examiner—James W. Davie
Assistant Examiner—Bertha Randolph
Attorney, Agent, or Firm—Emmanuel J. Lobato; Robert E. Burns

[57] ABSTRACT

A semiconductor light emitting element is disclosed, which is provided with a light emitting region having a diffraction grating formed by periodic corrugations, a modulation region having an external waveguide layer optically connected directly to the light emitting region and a pn junction separated from a pn junction of the light emitting region and a window region formed of a semiconductor having a larger energy gap than that of a light emitting layer of the light emitting region and extending from at least one end of the light emitting region and the external waveguide layer. The refractive index of the external waveguide is varied through utilization of the electrooptic effect so that the frequency or phase of light stably oscillating at a single wavelength is precisely controlled or modulated. In particular, when the window region is formed only outside the light emitting region, frequency modulation is carried out, and when the window region is formed at least outside the modulation region, phase modulation takes place.

12 Claims, 2 Drawing Figures

INTEGRATED SEMICONDUCTOR LIGHT EMITTING ELEMENT WITH OSCILLATION WAVELENGTH AND PHASE MODULATED LIGHT OUTPUT

BACKGROUND OF THE INVENTION

The present invention relates to a semiconductor light emitting element which is provided with an external modulation region independent of a light emitting region.

The optical fiber transmission technology, which is now being intensively developed, is to transmit information in accordance wtih the intensity of light. On the other hand, there is a growing tendency to the so-called coherent optical communication which transmits information by modulating the frequency or phase of light, and experiments utilizing low-loss optical fiber transmission and space propagation are being conducted by some researchers. Conventionally, the frequency or phase of light is modulated by employing an optical modulation element separately of a light emitting element, i.e. a semiconductor laser, or by a direct modulation method which varies the current to be injected into the semiconductor laser, or a method which partially modulates the current to be injected into a light emitting layer in a distributed feedback semiconductor laser (hereinafter referred to simply as a DFB laser). However, the former method calls for the insertion of an optical isolator between the semiconductor laser and the optical modulation element, and suffers a very great loss which is caused by the optical coupling of those elements. The latter methods perform the modulation by the injection current so as to cause a variation in carrier density in the laser region, and hence it encounters difficulty in precisely modulating the frequency or phase of light while retaining a narrow oscillation spectral width.

SUMMARY OF THE INVENTION

An object of the invention is to provide a semiconductor light emitting element capable of modulating the frequency or phase of light with high precision while retaining a small oscillation spectral width.

To attain the above objective, the semiconductor light emitting element of the present invention is provided with a light emitting region having a diffraction grating formed by periodic corrugations, a modulation region having an external waveguide layer optically connected directly to the light emitting region and a pn junction separated from a pn junction of the light emitting region and a window region formed of a semiconductor having a larger energy gap than that of a light emitting layer of the light emitting region and extending from at least one end of the light emitting region and the external waveguide layer. The refractive index of the external waveguide is varied through utilization of the electrooptic effect so that the frequency or phase of light stably oscillating at a single wavelength is precisely controlled or modulated. In particular, when the abovesaid window region is formed only outside the light emitting region, frequency modulation is carried out, and when the window region is formed at least outside the modulation region, phase modulation takes place.

BRIEF DESCRIPTION OF THE DRAWINGS

The present invention will be described in details below in comparison with the accompanying drawings, in which.

DETAILED DESCRIPTION

Figure 1:
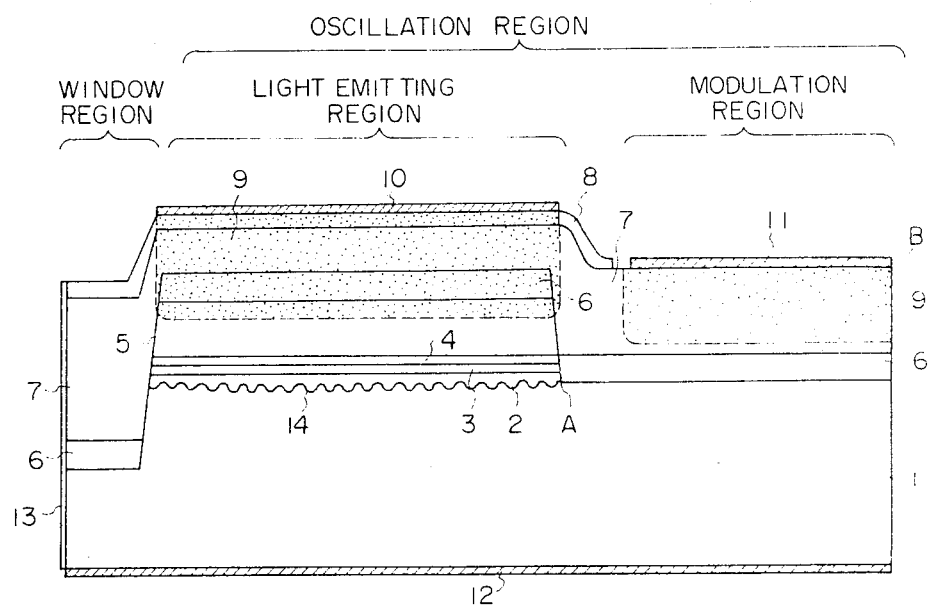
FIGS. 1 and 2 are sectional views schematically illustrating embodiments of the present invention.

With reference to FIG. 1 schematically illustrating an embodiment of the present invention which employs an InGaAsP/InP compound semiconductor, the light emitting region is composed of an InGaAsP waveguide layer 2, an n-tpe InGaAsP light emitting layer 3, a p-type InGaAsP buffer layer 4 and a p-type InP layer 5 laminated on an n-type InP substrate 1, an n-type InGaAsP layer 6 and an n-type InP layer 7 laminated next for the convenience of the manufacturing process, a cap layer 8 intended for good electric contact with metal, a zinc diffused layer 9 indicated by dot-hatching and an electrode 10. Incidentally, periodic corrugations 14 are formed in the waveguide layer 2 adjoining the light emitting layer 3 in this case. A pn junction is formed at a boundary between the n-type InGaAsP light emitting layer 3 and the p-type InGaAsP buffer layer 4. The above light emitting region is an ordinary DFB laser, and the present invention is also applicable to AlInGaAs/InP, AlGaAs/GaAs and like DFB lasers so long as they have the periodic corrugations.

Next, in the modulation region characteristic of the present invention, an external waveguide layer 6 constituted of n-type InGaAsP is disposed in direct contact with the light emitting layer 3, and in an n-type InP clad layer 7 which has a larger energy gap than that of the external waveguide layer 6, a zinc diffused region 9 is formed apart from the pn junction of the light emitting region, thereby forming a pn junction. Further, an electrode 11 is provided.

An n-type InP layer 7, which has a larger energy gap than that of the light emitting layer 3, is disposed in a manner to extend from the light emitting layer 3, forming the window region. Moreover, an antireflection film 13 is provided for preventing reflection by the end face of the element so as to effectively obtain the output from the light emitting layer 3 and to heighten the effect of suppressing the Fabry-Perot resonance. Reference numeral 12 indicates an electrode.

Next, a description will be given of the principles of operation of the present invention. Usually, the oscillation wavelength of the DFB laser having the diffraction grating 14 is in the vicinity of the Bragg wavelength determined by the period ($\Lambda$) of the corrugations, but strictly speaking, it varies with the phase of the diffraction grating 14 at the cleavage plane. In a case where the external waveguide layer 6 is provided in a manner to extend from the diffraction grating 14, as in the present invention, the phase of the corrugations at a boundary between the light emitting region and the modulation region (hereinafter referred to as the "boundary A") varies equivalently with the length of the external waveguide layer 6. Therefore, if the length of the external waveguide layer 6, that is, the position of the cleavage plane which is a light reflecting plane, is varied equivalently by some means, the oscillation wavelength can be made variable. The present invention performs the frequency modulation through utilization of this principle.

In FIG. 1, when injecting a current into the light emitting layer 3 of the light emitting region without applying any voltage to the pn junction of the modulation region, the DFB laser oscillates at a certain wavelength $\lambda_1$ under the influence of reflection in the cleavage plane of the modulation region (hereinafter referred to as the "end face B"). Specifically, the oscillation wavelength $\lambda_1$ is determined by the configuration of the corrugations at the boundary A and the equivalent length of the external waveguide layer 6 between the boundary A and the end face B (which equivalent length will hereinafter be identified by "l").

Next, when injecting a current into the light emitting layer 3 and applying a reverse voltage to the pn junction of the modulation region, the refractive index of the external waveguide layer 6 increases by virtue of the electrooptic effect and the above-mentioned equivalent length l of the external waveguide layer 6 increases, shifting the oscillation wavelength to $\lambda_2$. Accordingly, the oscillation wavelength can be varied depending upon whether or not the reverse voltage is applied to the pn junction of the modulation region, and hence the oscillation frequency can be changed.

In this example, since the oscillation output from the side of the window region is larger than the output from the other side, it will be advantageous to limit the length of the window region to such an extent that the output light is not substantially reflected in the window region.

Figure 2:
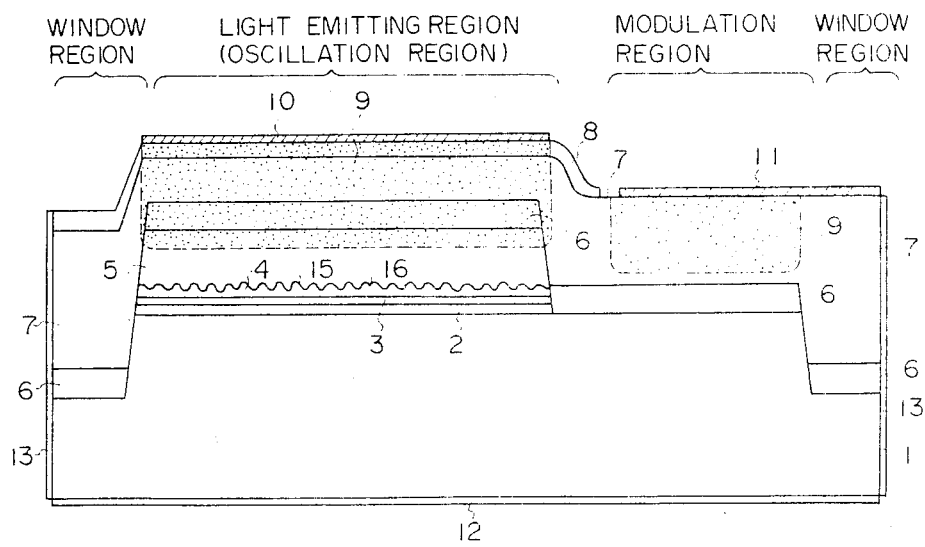

FIG. 2 illustrates another embodiment of the present invention. In this embodiment, a window region similar to that in FIG. 1 is disposed which extends from one end of each of the light emitting layer and the external waveguide layer, and the antireflection film 13 is coated on each end face. Accordingly, the laser operation of the light emitting region is not affected by the end faces and the oscillation wavelength is fixed. The layer structure of the light emitting region is substantially identical with that shown in FIG. 1, but the phase of periodic corrugations 15 is shifted, at a position indicated by reference 16, by a value corresponding to a quarter wavelength, by which is implemented a stable single-wavelength oscillation at a wavelength just twice the period of the corrugations on the assumption of the first order diffraction grating.

That is to say, in the embodiment of FIG. 2, unlike in the embodiment of FIG. 1, the oscillation wavelength is not varied with the length of the external waveguide layer 6 but a stable single-wavelength oscillation takes place in the light emitting region. Accordingly, the light emitting region and the oscillation region are identical with each other in this example.

The light that is stably oscillated at a single wavelength in the light emitting region is led out, as the output light, from the window region through the external waveguide layer 6 of the modulation region, and in this case, if the refractive index of the external waveguide layer 6 is varied, then the phase of light transmitting therethrough also varies. The present embodiment utilizes this principle to vary the phase of the output light since the application of a reverse voltage to the pn junction of the modulation region causes an increase in the refractive index of the external waveguide layer 6 owing to the electrooptic effect. Consequently, the phase modulation can be effected by turning "ON" and "OFF" the voltage of the modulation region. Even if no window region is provided on the side of the oscillation region, it is possible to similarly obtain a phase-modulated light output of a stable single wavelength.

While in the above description no mention has been made of a stripe structure for stablization of the lateral mode, it is a matter of course that the present invention is applicable to a buried heterostripe structure, a planoconvex waveguide stripe structure and so on as well.

As described above in detail, in accordance with the present invention, a semiconductor light emitting element is materialized which operates at a stable single wavelength and whose oscillation wavelength or phase can be modulated. Since it is the external modulation type utilizing the electrooptic effect, a modulated light output can be obtained while retaining a small spectral width without incurring variations in the carrier density in the light emitting region, as compared with the case of effecting the modulation by the injection current. Accordingly, the semiconductor light emitting element of the present invention can be applied to coherent optical communications, and hence is of great utility.

What we claim is:

1. In a semiconductor light emitting element having a light emitting region comprising a DFB laser having a substrate, a light emitting layer, periodic corrugations defining a diffraction grating, an a pn junction therein the improvement comprising an external modulation region on the substrate for modulating the phase or wavelength of the oscillations of the DFB laser light output having an external light waveguide layer of a larger energy band gap than that of the light emitting layer in direct contact with the DFB laser, a clad layer having a larger energy gap than that of the waveguide layer, a pn junction apart from the pn junction in the DFB laser, an electrode for applying a voltage to the pn junction of the modulation region for varying light output, and at least one semiconductor window region on said substrate at one end of the light emitting element for output of light from the element.

2. In a semiconductor light emitting element according to claim 1, in which said semiconductor window region is at the end of the element opposite to the modulation region for output of light of varying modulated wavelength upon application of a reverse bias voltage to the modulation region pn junction.

3. In a semiconductor light emitting element according to claim 2, in which said semiconductor window region comprises a layer having a larger energy gap than that of the waveguide layer.

4. In a semiconductor light emitting element according to claim 1, including a second semiconductor window region on said substrate extending from the modulation region for phase moudlated light output of the element, and the phase of said periodic corrugations being shifted at a position thereon by a value corresponding to a quarter wavelength.

5. A semiconductor light emitting element according to claim 4, in which said semiconductor in said second window region comprises an extension part of said clad layer of the modulation region.

6. In a semiconductor light emitting element according to claim 1, in which said external waveguide layer extends from the diffraction grating corrugations of the DFB laser of the light emitting region.

7. In a semiconductor light emitting element according to claim 6, in which the length of the external waveguide layer determines at least in part the oscillation wavelength.

8. In a semiconductor light emitting element according to claim 1, in which said window region is disposed extending externally on a side opposite from said modulation region, said external waveguide layer extending from the diffraction grating corrugations, and the external waveguide layer length determining oscillation wavelength without varying thereof.

9. In a semiconductor light emitting element having a light emitting region comprising a DFB laser having a substrate, a light emitting layer, periodic corrugations defining a diffraction grating and a pn junction therein, the improvement comprising an external modulation region on the substrate for modulating the oscillation wavelength of the DFB laser light output having a semiconductor external light waveguide layer in direct contact with the DFB laser for passing light from the laser therethrough, means in the modulation region for at times varying the oscillation wavelength of light output of the element, an electrode for applying a voltage to the modulation region for varying light output, and an external semiconductor light window region for output of the light at times modulated as to wavelength.

10. In a semiconductor light emitting element according to claim 9, in which said means in the modulation region for at times varying the oscillation wavelength of the light comprising means defining a pn junction in the modulation region, and means comprising the electrode for reverse biasing the last-mentioned pn junction with a reverse voltage.

11. In a semiconductor light emitting element according to claim 9, in which the external light waveguide layer is in direct contact with the light emitting layer and an end of the periodic corrugations of the DFB laser.

12. In a semiconductor light emitting element having a light emitting region comprising a DFB laser having a substrate, a light emitting layer, periodic corrugations defining a diffraction grating, and a pn junction therein the improvement comprising an external modulation region on the substrate for modulating the phase or wavelength of the oscillations of the DFB laser light output having an external light waveguide layer of a larger energy band gap than that of the light emitting layer in direct contact with the DFB laser, a clad layer having a larger energy gap than that of the waveguide layer, a pn junction apart from the pn junction in the DFB laser, an electrode for applying a voltage to the pn junction of the modulation region for varying light output, and two semiconductor window regions on said substrate at opposite ends of the light emitting element for output of light from the element.

* * * * *